United States Patent
Bertrand et al.

(10) Patent No.: US 12,424,995 B2
(45) Date of Patent: Sep. 23, 2025

(54) METHOD FOR MANUFACTURING A STRUCTURE COMPRISING A THIN LAYER TRANSFERRED ONTO A SUPPORT PROVIDED WITH A CHARGE TRAPPING LAYER

(71) Applicant: Soitec, Bernin (FR)

(72) Inventors: Isabelle Bertrand, Bernin (FR); Alexis Drouin, La Buissiere (FR); Isabelle Huyet, Crolles (FR); Eric Butaud, Grenoble (FR); Morgane Logiou, Crolles (FR)

(73) Assignee: SOITEC, Bernin (FR)

( * ) Notice: Subject to any disclaimer, the term of this patent is extended or adjusted under 35 U.S.C. 154(b) by 890 days.

(21) Appl. No.: 17/597,581

(22) PCT Filed: Mar. 26, 2020

(86) PCT No.: PCT/EP2020/058462
§ 371 (c)(1),
(2) Date: Jan. 12, 2022

(87) PCT Pub. No.: WO2021/008742
PCT Pub. Date: Jan. 21, 2021

(65) Prior Publication Data
US 2022/0247374 A1  Aug. 4, 2022

(30) Foreign Application Priority Data
Jul. 12, 2019  (FR) ........................ 1907859

(51) Int. Cl.
*H03H 9/02* (2006.01)
*H03H 3/08* (2006.01)

(52) U.S. Cl.
CPC .......... *H03H 3/08* (2013.01); *H03H 9/02559* (2013.01); *H03H 9/02929* (2013.01)

(58) Field of Classification Search
CPC . H03H 9/02559; H03H 9/02929; H10N 30/88
(Continued)

(56) References Cited

U.S. PATENT DOCUMENTS

| | | | |
|---|---|---|---|
| 6,544,656 B1 | 4/2003 | Abe et al. | |
| 7,268,060 B2 | 9/2007 | Ghyselen et al. | |

(Continued)

FOREIGN PATENT DOCUMENTS

| | | |
|---|---|---|
| FR | 2860341 B1 | 12/2005 |
| FR | 2933233 A1 | 1/2010 |

(Continued)

OTHER PUBLICATIONS

European Extended Search Report and Opinion for European Application No. 22172838.9, dated Jul. 18, 2022, 8 pages.

(Continued)

*Primary Examiner* — Derek J Rosenau
(74) *Attorney, Agent, or Firm* — TraskBritt

(57) ABSTRACT

A method for manufacturing a structure comprising a thin layer transferred onto a support provided with a charge trapping layer, the method comprising the following steps: —preparing the support comprising forming the trapping layer on a base substrate, the trapping layer having a hydrogen concentration of less than $10^{18}$ at/cm$^3$; —joining the support to a donor substrate by way of a dielectric layer having a hydrogen concentration of less than $10^{20}$ at/cm$^3$ or comprising a barrier preventing the diffusion of hydrogen toward the trapping layer or having low hydrogen diffusivity; —removing part of the donor substrate to form the thin layer; the manufacturing method exposing the structure to a temperature below a maximum temperature of 1000° C. The present disclosure also relates to a structure obtained at the end of this method.

20 Claims, 1 Drawing Sheet

(58) Field of Classification Search
USPC .................................................. 310/311, 348
See application file for complete search history.

(56) References Cited

U.S. PATENT DOCUMENTS

| | | | |
|---|---|---|---|
| 2015/0115480 A1 | 4/2015 | Peidous et al. | |
| 2015/0168326 A1 | 6/2015 | Allibert | |
| 2016/0071958 A1 | 3/2016 | Liu et al. | |
| 2016/0276209 A1 | 9/2016 | Usenko | |
| 2018/0158721 A1 | 6/2018 | Libbert et al. | |
| 2019/0027397 A1* | 1/2019 | Peidous | H01L 21/0262 |
| 2019/0372552 A1* | 12/2019 | Gaudin | H10N 30/072 |

FOREIGN PATENT DOCUMENTS

| | | |
|---|---|---|
| FR | 2953640 B1 | 2/2012 |
| JP | 2009-088498 A | 4/2009 |
| JP | 2017-005078 A | 1/2017 |
| KR | 10-2018-0104610 A | 9/2018 |
| WO | 2016/081367 A1 | 11/2015 |
| WO | 2016/087728 A1 | 6/2016 |
| WO | 2016/140850 A1 | 9/2016 |
| WO | 2017/142704 A1 | 8/2017 |
| WO | 2018/002504 A1 | 1/2018 |
| WO | 2018/002507 A1 | 1/2018 |
| WO | 2019/130895 A1 | 7/2019 |

OTHER PUBLICATIONS

Japanese Official Notice of Rejection for Application No. 2022-501248 dated Dec. 19, 2023, 2 pages.
Korean Office Action for Application No. 10-2022-7004773 dated Mar. 27, 2024, 19 pages with machine translation.
International Search Report for International Application No. PCT. EP2020/058462 dated Jun. 2, 2020, 2 pages.
International Written Opinion for International Application No. PCT.EP2020/058462 dated Jun. 2, 2020, 7 pages.
European Communication pursuant to Article 94(3) EPC for European Application No. 22172838.9, dated Jun. 12, 2025, 5 pages.
European Office Action for Application No. 22172838.9 dated Jun. 12, 2025, 5 pages.
Zhou et al., Interface Properties of SiOxNy Layer on Si Prepared by Atmospheric-Pressure Plasma Oxidation-Nitridation, Nanoscale Research Letters, (2013), vol. 8, No. 201, 6 pages.

* cited by examiner

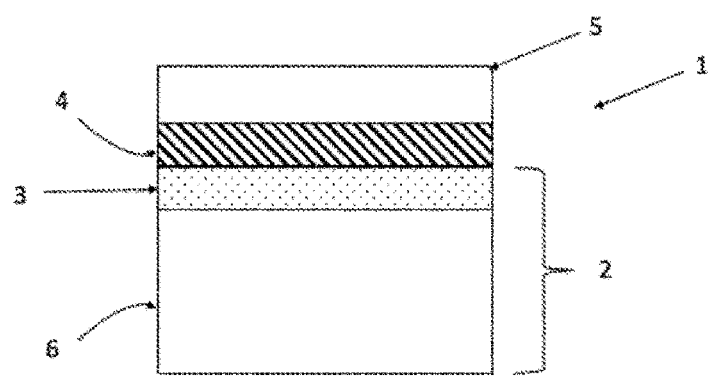

METHOD FOR MANUFACTURING A STRUCTURE COMPRISING A THIN LAYER TRANSFERRED ONTO A SUPPORT PROVIDED WITH A CHARGE TRAPPING LAYER

CROSS-REFERENCE TO RELATED APPLICATIONS

This application is a national phase entry under 35 U.S.C. § 371 of International Patent Application PCT/EP2020/058462, filed Mar. 26, 2020, designating the United States of America and published as International Patent Publication WO 2021/008742 A1 on Jan. 21, 2021, which claims the benefit under Article 8 of the Patent Cooperation Treaty to French Patent Application Serial No. FR1907859, filed Jul. 12, 2019.

TECHNICAL FIELD

The present disclosure relates to a method for manufacturing a structure comprising a thin layer transferred onto a support provided with a charge trapping layer.

BACKGROUND

Integrated devices are usually established on substrates in the form of wafers, which mainly serve as a support for their manufacture. However, the rise in the degree of integration and in the performance levels expected from these devices has resulted in an increasingly significant association between their performance levels and the characteristics of the substrate on which they are formed. This is particularly the case for radiofrequency (RF) devices, processing signals with a frequency that is between approximately 3 kHz and 300 GHz, which are particularly applicable in the field of telecommunications (telephony, Wi-Fi, BLUETOOTH®, etc.).

Using the example of a device/substrate coupling, electromagnetic fields that originate from the high-frequency signals propagating in the devices penetrate into the depth of the substrate and interact with the possible carriers of electric charges found therein. This results in unnecessary consumption of some of the energy of the signal through loss of insertion and possible influences between components through crosstalk.

Radiofrequency devices, such as filters, switches and antenna adapters, as well as power amplifiers, can be established on substrates that are specifically adapted to take these phenomena into account and improve their performance levels.

High-resistivity silicon-on-insulator (HR SOI) substrates are thus known that comprise a silicon support substrate having a resistivity of more than 1 kOhm·cm, a dielectric layer on the support substrate, and a thin surface layer of silicon placed on the insulating layer. The substrate can also include a charge trapping layer placed between the support substrate and the dielectric layer. The trapping layer can comprise non-doped polycrystalline silicon. The manufacture of this type of substrate is described, for example, in FR2860341, FR2933233, FR2953640, US2015/115480, U.S. Pat. No. 7,268,060 or U.S. Pat. No. 6,544,656. Generally, the intention is to limit the temperature and/or the duration of a heat treatment applied to such a substrate in order to avoid recrystallization of the trapping layer, which would degrade its radiofrequency performance levels.

There are other reasons why certain semiconductor structures cannot be exposed to high temperatures, for example, above 600° C. or 1000° C., during their manufacture or use. This is the case for structures formed from the assembly of two substrates with different thermal expansion coefficients. One of the substrates forms the support for the structure onto which a thin layer taken from the other substrate is transferred.

The nature of the thin layer, for example, when it comprises ferroelectric material, can also limit the treatment temperature of the structure to its Curie temperature, that is to say the temperature above which the material loses its permanent polarization.

In addition, there is sometimes an incentive to limit the exposure temperature of a semiconductor structure when the thin layer contains components. These components may have been formed directly on (or in) the structure or transferred onto a support to form this structure. Above an exposure temperature of 400° C. or 600° C., the diffusion of the dopants or metals constituting the components risks rendering them non-functional.

It is also possible to choose to intentionally limit the temperature to which elements of the structure are exposed. This is particularly the case when the charge trapping layer or the dielectric layer are formed by LPCVD ("low-pressure chemical vapor deposition") or PECVD ("plasma-enhanced chemical vapor deposition") techniques. These inexpensive techniques are collectively applicable to a plurality of substrates and are carried out at moderate temperatures of approximately 600 degrees.

It has been observed that the production of a structure comprising a layer for trapping electric charges and a dielectric layer by way of a manufacturing method using only moderate heat treatments (that is to say not exposing the structure to temperatures above 1000° C.) led to structures with radiofrequency (RF) performance levels that were much lower than expected.

As documented in the publication "White paper—RF SOI Characterisation" dated January 2015 and published by SOITEC, the RF performance of a substrate can be characterized by a second harmonic distortion measurement HD2. In the case of semiconductor structures comprising a charge trapping layer and implementing only moderate heat treatments, it has been observed that this HD2 characteristic could be between 55% and 75% of the expected value.

BRIEF SUMMARY

The present disclosure aims to address this problem, at least in part. It more particularly aims to propose a method for manufacturing a semiconductor structure comprising transferring a thin layer onto a support provided with a layer for trapping electric charges, with the method not employing heat treatment exposing the structure to a high temperature, but nonetheless resulting in a structure with compliant RF performance levels.

With a view to achieving this aim, the object of the present disclosure proposes a method for manufacturing a structure comprising a thin layer transferred onto a support provided with a charge trapping layer, the method comprising the following steps:

preparing the support comprising forming the trapping layer on a base substrate, the trapping layer having a hydrogen concentration of less than $10^{18}$ at/cm$^3$;

joining the support to a donor substrate by way of a dielectric layer having a hydrogen concentration of less than $10^{20}$ at/cm$^3$ or comprising a barrier preventing the diffusion of hydrogen toward the trapping layer or having low hydrogen diffusivity;

removing part of the donor substrate to form the thin layer; and the manufacturing method exposing the structure to a temperature below a maximum temperature of 1000° C.

Forming a trapping layer having a low hydrogen concentration during the support preparation step avoids excessively neutralizing the electric charge traps of this layer. Forming a dielectric layer that also has a low hydrogen concentration or that prevents the diffusion of this hydrogen avoids or limits its diffusion toward the trapping layer, in particular, during heat treatments to which this dielectric layer is exposed during the manufacturing method and after the joining step. Alternatively, a barrier may be provided in the dielectric layer preventing the diffusion of hydrogen from the dielectric layer toward the trapping layer.

According to other advantageous and non-limiting features of the present disclosure, taken alone or in any technically feasible combination:

the trapping layer is deposited at a deposition temperature between 600° C. and 950° C., and the step of preparing the support comprises a first stage of annealing the trapping layer in a hydrogen depleted atmosphere and at a temperature between the deposition temperature and 1000° C.;

the deposition of the trapping layer implements an LPCVD technique;

the trapping layer is formed by deposition at a temperature between 950° C. and 1100° C.;

the deposition of the trapping layer is implemented in an epitaxy frame;

the dielectric layer is produced by depositing a material having a hydrogen concentration of more than $10^{20}$ at/cm$^3$ followed by the application of a second annealing stage in a hydrogen depleted atmosphere;

the second annealing stage is between 800° C. and 900° C. for at least one hour in a neutral atmosphere;

the dielectric layer is produced by depositing a material having a hydrogen concentration of more than $10^{20}$ at/cm$^3$ onto the trapping layer before the application of the first annealing stage;

the dielectric layer is produced by thermal oxidation of the trapping layer at a temperature between 800° C. and 1000° C.;

the dielectric layer comprises the barrier and the barrier is in direct contact with the trapping layer;

the barrier comprises a layer of SiN or AlN;

the dielectric layer having low hydrogen diffusivity comprises an oxide having nitrogen in a nitrogen/oxygen ratio that is greater than or equal to 0.01 or 0.05;

the dielectric layer having low hydrogen diffusivity comprises a silicon oxide having nitrogen in a nitrogen/oxygen ratio of between 0.01 and 0.25 or between 0.05 and 0.1;

the manufacturing method comprises, before the joining step, a step of forming an embrittlement plane in the donor substrate and wherein the removal step is carried out by fracturing the donor substrate at the embrittlement plane;

the thin layer comprises a piezoelectric and/or ferroelectric material; and the thin layer is made of lithium tantalate or lithium niobate.

According to another aspect, the present disclosure proposes a structure that cannot be exposed to high temperatures, for example, higher than 600° C. or 1000° C., the structure comprising:

a base substrate;

a trapping layer placed on the base substrate and having a hydrogen concentration of less than $10^{18}$ at/cm$^3$;

a dielectric layer placed on the trapping layer, the dielectric layer having a hydrogen concentration of less than $10^{20}$ at/cm$^3$ or comprising a barrier preventing the diffusion of hydrogen toward the trapping layer or having low hydrogen diffusivity; and a thin layer placed on the dielectric layer.

According to other advantageous and non-limiting features of this aspect of the present disclosure, taken alone or in any technically feasible combination:

the thin layer comprises a ferroelectric material having a permanent polarization and a Curie temperature between 600° C. and 1000° C.;

the dielectric layer is in contact with the trapping layer and with the thin layer;

the dielectric layer having low hydrogen diffusivity comprises an oxide having nitrogen in a nitrogen/oxygen ratio that is greater than or equal to 0.01 or 0.05; and the dielectric layer having low diffusivity comprises a silicon oxide having nitrogen in a nitrogen/oxygen ratio of between 0.01 and 0.25 or between 0.05 and 0.1.

BRIEF DESCRIPTION OF THE DRAWINGS

Other features and advantages of the present disclosure will become apparent from the detailed description of the present disclosure that follows with reference to the accompanying figures, in which:

FIG. 1 shows a structure manufactured in accordance with an embodiment of a method according to the present description.

DETAILED DESCRIPTION

FIG. 1 shows a structure 1 that may be manufactured in accordance with an embodiment of a method of the present description. The structure 1 has a thin surface layer 5, a dielectric layer 4, for example, comprising an oxide such as a silicon oxide, and a support 2. The support 2 is provided with a charge trapping layer 3 placed on a base substrate 6. The trapping layer 3 is interposed between the dielectric layer 4 and the base substrate 6. Preferably, the dielectric layer 4 is in contact with the trapping layer 3 and with the thin layer 5.

Conventionally, the structure 1 can be in the form of a circular wafer with a diameter that can be 100, 200, 300 or even 450 mm.

As described in the documents previously discussed in the background section of the present disclosure, the structure 1 can be produced in many ways. As a common general rule, the structure 1 can be produced by a manufacturing method comprising joining the support 2 and a donor substrate, the dielectric layer being interposed between these two elements, followed by a step of removing part of the donor substrate to form the thin layer 5. The step of removing part of the donor substrate can be carried out by chemical-mechanical thinning of this substrate. Preferably, the structure 1 is manufactured by applying Smart Cut™ technology, according to which a layer intended to form the thin layer 5 is delimited by way of an embrittlement plane formed by the implantation of light species into the donor substrate. This layer is then removed from the donor substrate by fracturing at the embrittlement plane and is transferred onto the support 2 provided with the trapping layer 3 via the dielectric layer 4, interposed between the support 2 and the donor substrate.

The base substrate 6 is typically several hundred microns thick. Preferably, the base substrate has a high resistivity, greater than 1000 ohm·centimeter, and even more preferably greater than 2000 ohm·centimeter. This thus limits the density of charges, holes or electrons that are likely to move in the base substrate. However, the present disclosure is not limited to a base substrate 6 having such a resistivity, and it also provides RF performance advantages when the base substrate has a more compliant resistivity, of approximately a few hundred ohm·centimeters, for example, less than 1000 ohm·cm, or less than 500 ohm·cm or even less than 10 ohm·cm.

For availability and cost reasons, the base substrate 6 is preferably made of monocrystalline silicon. It may be, for example, a CZ silicon substrate with a low interstitial oxygen content of between 6 and 10 ppm, or an FZ silicon substrate that has, in particular, a naturally very low interstitial oxygen content. It can also be a CZ silicon substrate having a high quantity of interstitial oxygen (designated by the expression "High Oi") of more than 26 ppm. The base substrate can alternatively be formed from another material: it may be, for example, sapphire, glass, quartz, silicon carbide, etc. In certain circumstances, and, in particular, when the trapping layer 3 is thick enough, for example, more than 30 microns thick, the base substrate 6 may have a standard resistivity, of less than 1 kohm·cm.

The trapping layer 3 can be quite varied in nature, as recorded in the documents forming the prior art. Generally speaking, it is a non-crystalline layer having structural defects such as dislocations, grain boundaries, amorphous regions, interstices, inclusions, pores, etc. These structural defects form traps for the charges liable to circulate in the material, for example, at incomplete or pendant chemical bonds. This prevents conduction in the trapping layer, which consequently has high resistivity.

Advantageously, and for the sake of simplicity of implementation, this trapping layer 3 is formed of a layer of polycrystalline silicon. Its thickness, particularly when it is formed on a resistive base substrate 6, can range from 0.3 to 3 μm. However, other thicknesses below or above this range are quite conceivable, depending on the level of RF performance expected from the structure 1.

In order to seek to preserve the polycrystalline quality of this layer during heat treatments that can be applied to the structure 1, an amorphous layer, for example, made of silicon dioxide, can advantageously be provided on the base substrate 6 before the deposition of the charge trapping layer 3.

Alternatively, the trapping layer 3 may be formed by the implantation of a relatively heavy species, such as argon, in a surface thickness of the base substrate 6, in order to form there the structural defects constituting the electrical traps. This layer 3 can also be formed by porosification of a surface thickness of the base substrate 6 or by any other method capable of forming structural defects in a surface thickness of the base substrate 6, with these structural defects being capable of trapping electric charges.

The thin surface layer 5 can be of any suitable type. When the structure 1 is intended to receive integrated semiconductor components, the thin layer 5 can thus comprise monocrystalline silicon, or of any other semiconductor material such as germanium, silicon germanium, silicon carbide. When the structure 1 is intended to receive surface acoustic wave filters, the thin layer 5 can comprise a piezoelectric and/or ferroelectric material, such as lithium tantalate or lithium niobate. The thin layer 5 can also include finished or semi-finished integrated components, formed on the donor substrate and transferred onto the support 2 during the step of manufacturing the structure 1. Generally, the thin layer can be between 10 nm and 10 microns thick.

A method for manufacturing a structure in accordance with that shown in FIG. 1 will now be described. This method constitutes a preliminary experiment that led to the present disclosure. According to this experimental method, a charge trapping layer 3 of polycrystalline silicon was formed on a silicon base substrate 6 by deposition, using an LPCVD technique conducted between 600° C. and 650° C. The trapping layer 3 was approximately 1 micron thick.

A 300 nm to 1000 nm thick silicon oxide layer forming the dielectric layer 4 of the structure 1 was deposited onto the trapping layer 3 using a PECVD technique carried out at a temperature of 600° C. This deposition was followed by densification annealing carried out at 600° C. in a neutral or oxidizing atmosphere for approximately 1 hour. The layer was then polished by a chemical-mechanical polishing step (CMP) leading to removal of approximately 200 to 800 nanometers of the oxide to provide a surface having roughness of less than 0.3 nm RMS on a field of 5*5 microns.

A lithium tantalate ferroelectric donor substrate was implanted by hydrogen ions through a first one of its faces in order to form a buried embrittlement plane. A first layer was thus defined between this embrittlement plane and the first face of the donor substrate. The donor substrate was joined to the silicon oxide layer 4 placed on the support 2, and the donor substrate was then fractured at the embrittlement plane using moderate heat treatment of approximately 400° C. The first layer of the donor substrate was released to expose a free face of this layer, which could thus be prepared to improve the crystal quality and the surface condition. This preparation included a step of thinning the first layer by chemical-mechanical polishing and a step of heat treatment at 500° C. in a neutral atmosphere for 1 hour.

The level of RF performance expected from the structure thus produced was estimated by determining the value of HQF (harmonics quality factor) as taught in US2015/0168326. This HQF value can be estimated from the depth resistivity profile of the trapping layer 3 and the base substrate 6.

A characterization measurement referred to as a "second harmonic distortion" (HD2) was then carried out on the structure 1 thus prepared. This measurement is carried out at 900 MHz and is documented in the "White paper—RF SOI wafer characterisation" document presented in the introduction. More specifically, coplanar guides were formed by depositing aluminum lines on the free face of the thin surface layer of lithium tantalate. Then a signal with a frequency of 900 MHz is applied to one end of the guides and the second harmonic signal HD2 is measured at the other end. The weaker the second harmonic signal, the higher the performance level of the structure.

The HD2 measurement and the HQF estimation are particularly relevant characteristics of the structure 1, since they are highly representative of the performance of an integrated RF device that would be formed on this structure.

Unexpectedly, the value of the HD2 characteristic of the structure 1 at the end of the method that has just been described only corresponded to approximately 50% to 75% of the expected result provided by the HQF estimation.

Additional studies have shown that this low performance level was linked to the presence of excess hydrogen in the charge trapping layer 3 and in the dielectric layer 4. The dielectric layer, in this case SiO2, had more than $10^{20}$ at/cm^3 and the trapping layer 3 had more than $10^{18}$ at/cm^3 of hydrogen.

The dielectric layer 4, which is particularly hydrogen-rich, forms a type of reservoir, and the hydrogen retained in this layer 4 is capable of diffusing toward the trapping layer 3 when the difference in hydrogen concentration in the dielectric layer 4 and the trapping layer 3 is excessive, and taking into account the heat treatments applied to the structure 1. Consequently, the trapping layer is supplied with hydrogen by the dielectric layer 4. The hydrogen is then capable of neutralizing the electric traps of the trapping layer 3, in particular, at its interface with the dielectric layer 4. It is to be noted that in a conventional structure exposed to a temperature exceeding 1000° C., for example, in a final stage of finishing the structure, the hydrogen contained in the dielectric layer 4 or in the trapping layer 3 is removed by diffusion during the heat treatment, and that such a difference between the HD2 measurement and the HQF estimate therefore does not occur as significantly.

A manufacturing method was then developed that does not employ heat treatment exposing the structure to a high temperature, but that nonetheless results in a structure with compliant RF performance levels. "Compliant" means that the HD2 measurement does not deviate by more than 20% from its HQF estimate.

In general, this method aims to form a trapping layer 3 having a relatively low hydrogen concentration in order to avoid excessively neutralizing the electric charge traps. The aim is also to form a dielectric layer 4 having a low hydrogen concentration or limiting the diffusion of this hydrogen in order to avoid or to limit the migration of this hydrogen into the trapping layer, taking into account the heat treatments applied to the structure.

More specifically, this method repeats the steps of preparing the support 2, joining this support 2 to a donor substrate and removing part of the donor substrate that have just been described. For all the reasons stated in the introduction to this application, the structure 1 cannot be exposed to a temperature exceeding 1000° C. during its manufacture, during the joining step or following this step. However, in this method, the intention is to form, during the step of preparing the support, a trapping layer 3 having a low hydrogen concentration of less than $10^{18}$ at/cm^3 in order to avoid over-neutralizing the traps of this layer 3. At the same time, the intention is to form a dielectric layer 4 also having a low hydrogen concentration, less than $10^{20}$ at/cm^3, or limiting the diffusion of this hydrogen to avoid forming a hydrogen reservoir that would then be capable of diffusing toward the trapping layer 3 or at the interface with this layer. Alternatively, a barrier can be provided in the dielectric layer that prevents the diffusion of hydrogen toward the trapping layer. Advantageously, when the dielectric layer does not have a barrier layer or when it is not capable of trapping the hydrogen that it contains, the aim is to limit the concentration of hydrogen in the dielectric layer to less than $10^{19}$ at/cm^3, or even less than $10^{18}$ at/cm^3.

Several embodiments are conceivable for producing such trapping 3 and dielectric 4 layers.

Thus, and according to a first embodiment of the trapping layer 3, it can be formed by deposition at a moderate temperature, for example, strictly between 600° C. and 950° C. This can be a deposition of a polycrystalline silicon layer formed by an LPCVD technique implemented in a deposition furnace. It has been found that such a deposition leads to the formation of a trapping layer 3 comprising a hydrogen concentration of more than $10^{18}$ at/cm^3 and typically between this value and $1^{19}$ at/cm^3.

To reduce this concentration, according to this first embodiment, there is a first annealing stage of the trapping layer in a hydrogen depleted atmosphere (i.e., less than 5 ppm) at a temperature between the deposition temperature and 1000° C. Advantageously, the temperature of the first annealing stage is greater than 620° C., and preferably less than 900° C., for at least one hour and preferably for several hours. The hydrogen present in the trapping layer 3 is effectively exodiffused under these preferential annealing conditions in order to reduce its concentration below the threshold of $10^{18}$ at/cm^3, without damaging the polycrystalline nature of the trapping layer, by the recrystallization effect.

The first annealing stage can be carried out directly after the deposition of the trapping layer 3, or after the formation of the dielectric layer 4 when the latter is at least partly deposited onto the trapping layer 3, as will be specified in the remainder of this description.

According to a second embodiment of the trapping layer 3, it is deposited onto the base substrate 6 at a high temperature, for example, at a temperature between 950° C. and 1100° C. This can be a deposition of polycrystalline silicon produced in an epitaxy reactor. Under such deposition conditions, the trapping layer 3 has a hydrogen concentration several times lower than that of a layer formed by an LPCVD technique. In all cases, care should be taken to ensure that this concentration is less than $10^{18}$ at/cm^3. In this second embodiment, in which the trapping layer 3 is directly formed so that it has a low hydrogen concentration, the first annealing stage that was provided in the previous embodiment to exodiffuse the hydrogen is not necessary.

The dielectric layer 4, for its part, can be formed by deposition on the trapping layer 3. Alternatively, or in addition, it can be formed in whole or in part by deposition on the first face of the donor substrate. It is possible to choose to form the dielectric layer 4 on the support or on the donor substrate, depending on whether it is possible to expose them to a relatively high temperature.

Thus, and according to a first embodiment of the dielectric layer 4, it is produced by depositing silicon oxide in a deposition furnace using a PECVD technique. This deposition is carried out at a moderate temperature, typically between 600° C. and 800° C. In this case, the dielectric layer 4 has a significant hydrogen concentration of more than $10^{20}$ at/cm^3.

To reduce this concentration, a second annealing stage is applied, referred to as "densification," similar to the first annealing stage described above. It therefore involves annealing in a hydrogen-depleted atmosphere (i.e., less than 5 ppm) and exposing the dielectric layer 4 to a temperature that is higher than its deposition temperature. This can be a neutral or oxidizing atmosphere. Preferably, this temperature is greater than 800° C., typically between 800° C. and 900° C. The annealing is continued for at least one hour, and preferably for several hours, so as to finally exodiffuse the hydrogen from the dielectric layer 4, and possibly from the trapping layer 3. At the end of this densification annealing, the dielectric layer 4 has a hydrogen concentration of less than $10^{20}$ at/cm^3 and the trapping layer 3 has a hydrogen concentration of less than $10^{18}$ at/cm^3.

It should be noted that the second densification annealing stage may modify characteristics of the dielectric layer other than its hydrogen concentration. It can lead to, in particular, the reduction of the diffusivity of the hydrogen, that is to say the ability of this species to diffuse into the material constituting the dielectric layer, so that the hydrogen, even with a relatively high concentration (of approximately $10^{20}$ at/cm$^3$), is less likely to diffuse toward the trapping layer 3.

It is generally preferable to place the dielectric layer 4 on the support 2 rather than on the donor substrate. Indeed, it is generally possible to heat treat this support 2 at the temperature of the first and/or second annealing stage, which is not always the case for the donor substrate. For example, this substrate may have an embrittlement plane, or comprise a ferroelectric material having a relatively low Curie temperature or include components, which, in each of these cases, limits the thermal budget applicable thereto to a few hundred degrees for a relatively short time, i.e., less than 1 hour. However, the present disclosure does not exclude that, in some favorable cases, the dielectric layer 4 may be at least partly formed on the donor substrate.

When the dielectric layer 4 is formed on the trapping layer 3, and these two layers have been deposited at a relatively low temperature, as has just been described, it is not necessary to apply the first and second annealing stages, respectively, after each deposition step. As already briefly mentioned, it is possible to carry out a single annealing stage, under conditions similar to the first and second annealing stages, after the formation of the dielectric layer 4 on the trapping layer 3 at a low temperature. In other words, in this case, specific annealing of the trapping layer 3 does not need to be applied before the deposition of the dielectric layer 4.

According to a second embodiment of the dielectric layer 4, it can be produced by thermal oxidation of the trapping layer 3. Such a treatment can be implemented by exposing the support 2 provided with the trapping layer 3 to an oxidation furnace at a temperature that is strictly between 800° C. and 1000° C. and in an oxygen-rich atmosphere. This can be a dry or wet atmosphere. As is well known per se, the duration of this exposure is chosen according to the desired thickness of the dielectric layer 4. It is generally preferable to limit the oxidation temperature to 1000° C. to avoid any risk of recrystallization of the trapping layer 3. Moreover, it will be preferable for such a dielectric layer 4 to be produced by oxidation of a trapping layer 3 formed at a high temperature in accordance with the second embodiment of this layer that has been described above. Indeed, such a layer has greater temperature stability with respect to the risk of recrystallization.

A dielectric layer 4 formed by thermal oxidation of the trapping layer, made of silicon dioxide when the trapping layer 3 is made of silicon (which is often the case), has a particularly low hydrogen concentration, of approximately a few $10^{17}$ at/cm$^3$, at the detection limit of the conventional measurement methods. Optionally, a step of polishing the surface of the trapping layer 3 thus oxidized may be introduced in order to make it compatible with the subsequent joining step.

The dielectric layer 4 can also be prepared according to a third embodiment, which is of particular interest when it is not possible to expose the dielectric layer 4 to a relatively high temperature, for example, greater than 800° C. In this case, the dielectric layer 4 can be formed at a relatively low temperature, for example, in accordance with the first embodiment of this layer, and care is taken to include a barrier in the dielectric layer 4, which prevents the diffusion of hydrogen into the trapping layer.

Thus, and although the dielectric layer 4 can have a hydrogen concentration of more than $10^{20}$ at/cm$^3$, the diffusion of the hydrogen contained in the dielectric layer 4 toward the trapping layer 3 is prevented, which trapping layer in turn has a concentration of less than $10^{18}$ at/cm$^3$.

This thus avoids neutralizing the electric charge traps of this layer 3. In a variant, the dielectric layer 4 consists entirely of the barrier, which retains any hydrogen it may contain within it.

The barrier can consist of or comprise a layer of silicon nitride or aluminum nitride that is more than 10 nanometers thick and that is typically between 10 and 100 nanometers thick. The barrier can be deposited directly onto the trapping layer 3, for example, by a PECVD technique, before the formation of the remainder of the dielectric layer 4, for example, made of silicon dioxide and hydrogen-rich. Alternatively, this barrier can be formed on the donor substrate, and in this case after the remainder of the dielectric layer 4 has been formed so that the barrier can be brought into contact with the trapping layer 3 during the following step of joining the donor and the support 2.

In another variant, the barrier layer is formed from a silicon oxide layer having a very low hydrogen concentration, of approximately $10^{17}$ at/cm$^3$. In this case, the barrier forms a buffer that absorbs the hydrogen from the dielectric layer and therefore prevents its diffusion toward the trapping layer 3. In this case, a sufficient thickness of the barrier layer will be provided, taking into account the thickness of the dielectric layer and its hydrogen concentration, so that after diffusion of this hydrogen into the barrier layer, its hydrogen concentration does not exceed $10^{20}$ at/cm$^3$. This variant can be implemented when the dielectric layer is formed by deposition on the side of the donor substrate, and the barrier layer is formed by thermal oxidation of the trapping layer 3, as has been described in relation to the second embodiment of this dielectric layer 4.

According to yet another approach, provision can be made for the dielectric layer 4 to have any concentration of hydrogen, but for this layer 4 to have low diffusivity of this hydrogen, which therefore remains sufficiently trapped therein so as not to significantly diffuse toward the trapping layer 3. In this case, the dielectric layer 4 can consist entirely of a layer formed from a material that prevents the diffusion of the hydrogen that it contains. It can thus involve a deposited oxide, for example, a silicon oxide SiON, having nitrogen in a nitrogen/oxygen ratio that is greater than or equal to 0.01 or advantageously greater than or equal to 0.05. When the dielectric layer 4 is based on silicon oxide, which is very common, it is possible to choose not to exceed a nitrogen/oxygen ratio not exceeding 0.1 or 0.25 so as not to excessively modify the characteristics of this material and maintain a behavior that is equivalent or close to that of a simple silicon oxide SiO2. It is to be noted that such a nitrogen-rich oxide layer can easily be formed by a deposition technique, for example, PECVD, at least one of the carrier gases of which can be chosen to be nitrogen, which can be incorporated in the oxide layer in a controlled manner. The nitrogen/oxide ratio can be measured by a technique known as EDX (for "energy-dispersive X-ray spectroscopy") or established from nitrogen and oxygen measurements determined by SIMS (secondary ion mass spectrometry) measurements in the oxide layer 4.

In general, a dielectric layer 4 will be said to have low diffusivity of the hydrogen it contains when a structure comprises:
- a dielectric layer containing a concentration of at least $10^{20}$ at/cm$^3$ of hydrogen, and placed in contact with this layer; and
- a trapping layer of 1 micron of polycrystalline silicon initially having a concentration containing a concentration of less than $10^{18}$ at/cm$^3$ of hydrogen, undergoes annealing at 500° C. for 1 hour, and leads to the measurement in the trapping layer, at the end of the heat treatment, of a hydrogen concentration of less than $10^{18}$ at/cm$^3$.

The dielectric layer 4 can consist, over its entire thickness, of a material having low diffusivity, for example, a deposited oxide comprising nitrogen in the proportions mentioned above. Alternatively, provision may be made for only one barrier layer preventing the diffusion of hydrogen toward the trapping layer 3 to be formed by this material with low diffusivity, in the configuration presented in the previous alternative.

The joining step may be preceded by polishing of at least some of the faces that are brought into contact, in particular, with those corresponding to the exposed faces of the deposited trapping and/or dielectric layers. Moreover, as has been seen, this joining step is followed by the removal of part of the donor substrate in order to form the thin layer 5. This removal can be achieved by thinning or by fracturing the donor substrate. A step of preparing the transferred layer may be provided, for example, a polishing and/or thermal annealing step, in order to improve the characteristics of the thin layer 5.

The steps of joining, removing part of the donor substrate and preparing the transferred layer are carried out at moderate temperatures, exposing the structure 1 to temperatures that are always below 1000° C., and preferably below 800° C. or 600° C. More generally, the intention is to limit the temperature exposure of the dielectric layer 4, at least during and after the joining step during the manufacturing method, in order to thereby limit the diffusion of hydrogen from this layer toward the trapping layer 3. As a general rule, the higher the concentration in the dielectric layer (while remaining below the threshold of $10^{20}$ at/cm$^3$), the more the maximum temperature to which the dielectric layer 4 and the structure 1 are exposed will be limited.

Irrespective of the chosen embodiments of the trapping layer 3 and of the dielectric layer 4, a structure 1 is available at the end of the manufacturing method that has just been described, as shown in FIG. 1, comprising:

- a base substrate 6;
- a trapping layer 3 placed on the base substrate 6 and having a hydrogen concentration of less than $10^{18}$ at/cm$^3$;
- a dielectric layer 4 placed on the trapping layer 3, and advantageously in contact with this layer. The dielectric layer 4 has a hydrogen concentration of less than $10^{20}$ at/cm$^3$ or comprises a barrier preventing the diffusion of hydrogen toward the trapping layer 3 or has any hydrogen concentration, but then has a very low hydrogen diffusivity; and
- a thin layer 5 placed on the dielectric layer 4 and preferably in contact with this layer. This thin layer 5 can consist of a semiconductor material such as silicon, an insulator such as a ferroelectric material or a layer comprising integrated semiconductor components.

Advantageously, the hydrogen concentration in the dielectric layer is less than $10^{19}$ at/cm$^3$, or even $10^{18}$ at/cm$^3$.

The dielectric layer can comprise an oxide having nitrogen in a nitrogen/oxygen ratio that is greater than or equal to 0.01 or 0.05. In this case, its hydrogen concentration can be arbitrary. It can consist of or comprise a silicon oxide having nitrogen in a nitrogen/oxygen ratio of between 0.01 and 0.25 or between 0.05 and 0.1.

When the thin layer comprises a ferroelectric material having a Curie temperature below 1000° C., and typically between 600° C. and 1000° C., it is possible to manufacture the structure without exceeding any exposure of this thin layer to a temperature higher than this Curie temperature, and therefore preserving its permanent polarization.

For example, a plurality of supports 2 was produced comprising a silicon base substrate 6 having a resistivity of 3000 ohm·cm and on which a trapping layer 3 made of polycrystalline silicon having a thickness of 1 micron and formed by LPCVD, and a dielectric layer made of silicon oxide that is 300 nanometers thick and is formed by a PECVD technique, were successively produced.

A densification annealing stage of the stack was applied to a first batch of supports thus produced at a temperature of 600° C. for one hour in an atmosphere that was oxygen-rich and had less than 5 ppm of hydrogen.

A second and a third batch were exposed to a densification annealing stage in accordance with the present disclosure, which was oxygen-rich and had less than 5 ppm of hydrogen, for at least one hour and at a temperature of 800° C. and 900° C., respectively.

After the densification annealing stage, the hydrogen concentration was measured in the trapping layer ("H trapping—post dense") and the dielectric layer ("H dielectric").

A thin surface layer 5 of lithium tantalate was transferred onto the supports 2 of each of these batches using the Smart Cut™ method. This layer was prepared so that it is ultimately 600 nm thick. The steps of manufacturing structures included moderate annealing, which did not exceed 600° C. On the three batches of structures thus prepared, measurements were taken of the hydrogen concentration of the trapping layer 3 ("H trapping—structure"), of the second harmonic ("HD2"—for an applied signal of 15 dBm) and of the resistivity profile of the supports 2 in order to determine quality factors ("HQF"). It is noted that this HQF value allows the expected, compliant value of the RF performance of a structure to be estimated.

The average results on each of the first, second and third batches are shown in the table below:

TABLE 1

| Batch | HD2 | HQF | HD2/HQF | H trapping | H Dielectric |
|---|---|---|---|---|---|
| 1 | −60 dBm | −92 dBm | 65% | Post dense: 1.5 $10^{18}$ at/cm$^3$ Structure: >4.$10^{18}$ at/cm$^3$ | $10^{21}$ at/cm$^3$ |
| 2 | −79.4 dBm | −95 dBm | 83% | Post dense: 2 $10^{17}$ at/cm$^3$ Structure: $10^{18}$ at/cm$^3$ | $10^{20}$ at/cm$^3$ |

TABLE 1-continued

| Batch | HD2 | HQF | HD2/HQF | H trapping | H Dielectric |
|---|---|---|---|---|---|
| 3 | −84.2 dBM | −83 dBm | 100% | Post dense: 1.5 10^17 at/cm^3 Structure: 10^18 at/cm^3 | 6.10^19 |

It can be seen that the RF performance levels of the structures of the first batch, having received treatments from the prior art, are well below the expectation (the HD2/HQF ratio is 65%). It can be seen that the hydrogen concentration in the different layers exceeds the limit values, in particular, the hydrogen concentration of the trapping layer 3 just after the densification annealing stage ("post dense"), as well as in the final structure ("Structure").

By contrast, the RF performance levels of the structures of the second batch and of the third batch, which received treatments in accordance with the present disclosure, are clearly at the expected level (HD2/HQF ratio of 83% and 100%, respectively).

It can be seen that the hydrogen concentration in the trapping layer 3, measured after the complete manufacture of the structure, is greater than the concentration measured just after the densification annealing stage. However, this concentration remains less than or equal to the threshold of 10^18 at/cm^3, which allows the RF performance to remain compliant. The hydrogen present in the dielectric layer did not migrate significantly toward the trapping layer, even after being heat treated during the manufacture of the structure 1.

It is to be noted that the susceptibility of a structure 1 having a trapping layer 3 under the dielectric layer 4 is all the more sensitive to the hydrogen contained in this layer the thinner the trapping layer. Indeed, for the same quantity of hydrogen diffused from the dielectric layer 4 to the trapping layer 3, the concentration of hydrogen in this trapping layer will be greater in a relatively thin trapping layer than in a relatively thick trapping layer. As such, the approach of the present disclosure is particularly advantageous when the trapping layer is less than 1 micron, or 750 nm, thick or is less than or equal to 500 nm thick. In such a configuration of a relatively thin trapping layer, of less than 1 micron, it will be possible, in particular, to choose to integrate into the dielectric layer 4, as close as possible to the trapping layer, a barrier layer or a SiON layer that limits the diffusion of hydrogen, the thickness of which can be, for example, from 20 to 50 nm. For example, a layer of silicon oxide can be formed on the trapping layer, and this layer can be prepared using a nitrogen-based plasma to incorporate this nitrogen superficially before it is joined to another portion of the dielectric layer 4 placed on the side of the donor substrate. A barrier layer of nitrogen-rich SiO is thus formed over the surface thickness of the oxide layer, which prevents the diffusion of the hydrogen contained in the rest of the dielectric layer 4 toward the trapping layer.

By way of a reminder, the RF performance of a structure has a determining influence on the quality factor of the components formed on this structure. It has been verified, in additional observations, that the anti-resonance conductance of resonators formed on a structure produced using a method in accordance with the present disclosure was directly linked to the RF performance of the structure. Such resonators can be formed by interdigitated combs formed on substrates identical or similar to those of batches 1 or 2 described above. The quality factor of such a resonator is generally determined as the ratio between the electrical resistance at the anti-resonant frequency and the bandwidth halfway up this resistance. This quality factor was evaluated, on the resonators produced on the structures of batches 2 and 3 in accordance with the present disclosure, as being much higher than the quality factor of the resonators produced on the structures of batch 1.

Of course, the present disclosure is not limited to the embodiments described and it is possible to add variants without departing from the scope of the present disclosure as defined by the claims.

In particular, the thin layer 5 can comprise or be formed by a ferroelectric material, for example, $LiTaO_3$, $LiNbO_3$, $LiAlO_3$, $BaTiO_3$, $PbZrTiO_3$, $KNbO_3$, $BaZrO_3$, $CaTiO_3$, $PbTiO_3$ or $KTaO_3$.

The donor substrate from which the thin layer 5 is taken can assume the form of a circular wafer of standardized size, for example, 150 mm or 200 mm in diameter. However, the present disclosure is by no means limited to these dimensions or to this shape. The donor substrate may have been removed from an ingot of ferroelectric material, with this removal having been carried out so that the donor substrate has a predetermined crystal orientation, or the donor substrate may even comprise a layer of ferroelectric material joined to a substrate support.

The crystalline orientation of the thin layer of ferroelectric material may be chosen according to the intended application. Thus, with regard to the $LiTaO_3$ material, it is common practice to choose an orientation of between 30° and 60° XY, or of between 40° and 50° XY, in particular, in the case where the intention is to take advantage of the properties of the thin layer to form a surface acoustic wave (SAW) filter. Regarding the $LiNbO_3$ material, it is common practice to choose an orientation of approximately 128° XY. However, the present disclosure is by no means limited to a particular crystal orientation.

The invention claimed is:

1. A method for manufacturing a structure comprising a thin layer composed of a piezoelectric and/or ferroelectric material and transferred onto a support provided with a charge trapping layer, the method comprising the following steps:
   preparing the support comprising forming the charge trapping layer on a base substrate, the charge trapping layer having a hydrogen concentration of less than 10^18 at/cm^3;
   joining the support to a donor substrate by way of a dielectric layer comprising a silicon oxide having nitrogen in a nitrogen/oxygen ratio of between 0.01 and 0.25; and
   removing part of the donor substrate to form the thin layer; and
   the manufacturing method exposing the structure to a temperature below a maximum temperature of 1000° C. at least during and after the joining step.

2. The method of claim 1, wherein the charge trapping layer is deposited at a deposition temperature between 600° C. and 950° C., and the step of preparing the support comprises a first stage of annealing the charge trapping layer in a hydrogen depleted atmosphere and at a temperature between the deposition temperature and 1000° C.

3. The method of claim 2, wherein the deposition of the charge trapping layer comprises depositing the charge trapping layer using LPCVD.

4. The method of claim 3, wherein the nitrogen/oxygen ratio is between 0.05 and 0.1.

5. The method of claim 3, further comprising, before the joining step, a step of forming an embrittlement plane in the donor substrate, and wherein the removing step is carried out by fracturing the donor substrate at the embrittlement plane.

6. The method of claim 3, further comprising selecting the thin layer to comprise lithium tantalate or lithium niobate.

7. The method of claim 1, further comprising forming the charge trapping layer by deposition at a temperature between 950° C. and 1100° C.

8. The method of claim 4, further comprising forming the charge trapping layer by deposition in an epitaxy frame.

9. The method of claim 8, wherein the nitrogen/oxygen ratio is between 0.05 and 0.1.

10. The method of claim 8, further comprising, before the joining step, a step of forming an embrittlement plane in the donor substrate, and wherein the removing step is carried out by fracturing the donor substrate at the embrittlement plane.

11. The method of claim 8, further comprising selecting the thin layer to comprise lithium tantalate or lithium niobate.

12. The method of claim 1, wherein the nitrogen/oxygen ratio is between 0.05 and 0.1.

13. The method of claim 1, further comprising, before the joining step, a step of forming an embrittlement plane in the donor substrate, and wherein the removing step is carried out by fracturing the donor substrate at the embrittlement plane.

14. The method of claim 1, further comprising selecting the thin layer to comprise lithium tantalate or lithium niobate.

15. A structure, the structure comprising:
a base substrate;
a trapping layer on the base substrate and having a hydrogen concentration of less than $10^{18}$ at/cm$^3$;
a dielectric layer on the trapping layer, the dielectric layer comprising a silicon oxide having nitrogen in a nitrogen/oxygen ratio of between 0.01 and 0.25; and
a thin layer on the dielectric layer comprising a piezoelectric and/or ferroelectric material.

16. The structure of claim 15, wherein the thin layer comprises a ferroelectric material having a permanent polarization and a Curie temperature between 600° C. and 1000° C.

17. The structure of claim 16, wherein the dielectric layer is in contact with the trapping layer and with the thin layer.

18. The structure of claim 17, wherein the nitrogen/oxygen ratio is between 0.05 and 0.1.

19. The structure of claim 15, wherein the dielectric layer is in contact with the trapping layer and with the thin layer.

20. The structure of claim 15, wherein the nitrogen/oxygen ratio is between 0.05 and 0.1.

* * * * *